United States Patent
Van Den Ende et al.

(10) Patent No.: US 11,251,356 B2
(45) Date of Patent: Feb. 15, 2022

(54) ACTUATOR AND SENSOR DEVICE BASED ON ELECTROACTIVE POLYMER

(71) Applicant: KONINKLIJKE PHILIPS N.V., Eindhoven (NL)

(72) Inventors: Daan Anton Van Den Ende, Eindhoven (NL); Mark Thomas Johnson, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 724 days.

(21) Appl. No.: 15/752,974

(22) PCT Filed: Aug. 1, 2016

(86) PCT No.: PCT/EP2016/068266
§ 371 (c)(1),
(2) Date: Feb. 15, 2018

(87) PCT Pub. No.: WO2017/036695
PCT Pub. Date: Mar. 9, 2017

(65) Prior Publication Data
US 2018/0248105 A1 Aug. 30, 2018

(30) Foreign Application Priority Data
Aug. 31, 2015 (EP) .................... 15183152

(51) Int. Cl.
*H01L 41/04* (2006.01)
*H01L 41/09* (2006.01)
(Continued)

(52) U.S. Cl.
CPC ........ *H01L 41/042* (2013.01); *H01L 41/0926* (2013.01); *H01L 41/1132* (2013.01); *H01L 41/193* (2013.01)

(58) Field of Classification Search
CPC ............... H01L 41/042; H01L 41/0926; H01L 41/1132; H01L 41/193
(Continued)

(56) References Cited

U.S. PATENT DOCUMENTS 6,812,624 B1 * 11/2004 Pei ..................... H01L 41/0478
310/309
7,893,965 B2 2/2011 Heim et al.
(Continued)

FOREIGN PATENT DOCUMENTS

CN 102236463 A 11/2011
CN 102272702 A 12/2011
(Continued)

OTHER PUBLICATIONS

Kawamata A et al.: "Self-Sensing Piezoelectric Actuator using Permittivity Detection", Ferr0electrics,vol. 368, No. 1, 2008, pp. 194-201,XP055246690,ISSN:0015-0193.
(Continued)

*Primary Examiner* — Bryan P Gordon
(74) *Attorney, Agent, or Firm* — Schott, P.C.

(57) ABSTRACT

Provided is a combined actuator and sensor device having an electroactive polymer (EAP) structure (22) and a controller for generating drive signals applied to the EAP structure. The controller is adapted to superpose a small high-frequency AC sensing signal (34) on top of a larger actuation drive signal (32), the sensing signal having a frequency which resonates with the mechanical resonance frequency or anti-resonance frequency of the EAP structure. Application of mechanical loads to the device may be identified in changes in the impedance of the EAP structure, caused by damping of the mechanical resonance. In this way the device
(Continued)

facilitates simultaneous sensing and actuation. A corresponding method of simultaneous sensing and actuation is also provided.

22 Claims, 4 Drawing Sheets

(51) Int. Cl.
*H01L 41/193* (2006.01)
*H01L 41/113* (2006.01)

(58) Field of Classification Search
USPC .......................................... 310/313–319, 800
See application file for complete search history.

(56) References Cited

U.S. PATENT DOCUMENTS

| 9,872,606 | B2* | 1/2018 | Yeoh ...................... A61B 1/042 |
| 2002/0130673 | A1 | 9/2002 | Pelrine et al. |
| 2003/0067245 | A1 | 4/2003 | Pelrine et al. |
| 2006/0169837 | A1* | 8/2006 | Bird ...................... H01L 41/042 244/99.8 |
| 2007/0200468 | A1* | 8/2007 | Heim .................. H01L 41/0986 310/311 |
| 2009/0021114 | A1 | 1/2009 | Adachi |
| 2009/0085444 | A1 | 4/2009 | Alvarez et al. |
| 2010/0164324 | A1 | 7/2010 | Kim et al. |
| 2014/0035735 | A1 | 2/2014 | Zellers et al. |
| 2014/0139329 | A1 | 5/2014 | Ramstein et al. |
| 2016/0025429 | A1* | 1/2016 | Muir ...................... F04D 33/00 165/120 |
| 2016/0343637 | A1* | 11/2016 | Axelrod ................ H01L 23/467 |
| 2019/0357882 | A1* | 11/2019 | Johnson ................ B32B 25/042 |
| 2020/0052184 | A1* | 2/2020 | Hilgers ............... H01L 41/0471 |

FOREIGN PATENT DOCUMENTS

| CN | 103237774 A | 8/2013 |
| CN | 103493233 A | 1/2014 |
| DE | 10063535 A1 | 7/2002 |
| EP | 2654194 A1 | 10/2013 |
| WO | 2007029275 A1 | 3/2007 |
| WO | 2009015151 A1 | 1/2009 |
| WO | 2012122440 A2 | 9/2012 |

OTHER PUBLICATIONS

Chen D et al.; "Optimal haptic feedback control of artificial muscles",Electroactive Polymer Actuators and Devices, Mar. 10-13, 2014, San Diego, CA; Proceedings of SPIE,vol. 9056, 2014, pp. 90562K1-90562K6.

Toth L A et al: "Control System Design for a Dielectric Elastomer Actuator: the Sensory Subsystem", Smart Structures and Materials 2002:Electroactive Polymer Actuators and Devices, Mar. 18-21, 2002, San Diego, CA;Proceedings of SPIE,vol. 4695, 2002, pp. 323-334.

Grasso etal:"Piezoelectric self sensing actuators for high voltage excitation",Smart Materials and Structures, vol. 22, No. 6, May 3, 2013 (May 3, 2013),pp. 65018/1-13.

* cited by examiner

ACTUATOR AND SENSOR DEVICE BASED ON ELECTROACTIVE POLYMER

CROSS-REFERENCE TO PRIOR APPLICATIONS

This application is the U.S. National Phase application under 35 U.S.C. § 371 of International Application No. PCT/EP2016/068266, filed on Aug. 1, 2016, which claims the benefit of EP Patent Application No. EP 15183152.6, filed on Aug. 31, 2015. These applications are hereby incorporated by reference herein.

FIELD OF THE INVENTION

This invention relates to actuator/sensor devices which make use of electroactive materials for actuation and sensing.

BACKGROUND OF THE INVENTION

Electroactive materials (EAM) are a class of materials within the field of electrically responsive materials. When implemented in an actuation device, subjecting an EAM to an electrical drive signal can make them change in size and/or shape. This effect can be used for actuation and sensing purposes. There exist inorganic and organic EAMs. A special kind of organic EAMs are Electroactive polymers (EAPs). Electroactive polymers (EAP) are an emerging class of electrically responsive materials. EAPs, like EAMs can work as sensors or actuators, but can be more easily manufactured into various shapes allowing easy integration into a large variety of systems. Other advantages of EAPs include low power, small form factor, flexibility, noiseless operation, and accuracy, the possibility of high resolution, fast response times, and cyclic actuation. An EAP device can be used in any application in which a small amount of movement of a component or feature is desired, based on electric actuation. Similarly, the technology can be used for sensing small movements. The use of EAPs enables functions which were not possible before, or offers a big advantage over common sensor/actuator solutions, due to the combination of a relatively large deformation and force in a small volume or thin form factor, compared to common actuators. EAPs also give noiseless operation, accurate electronic control, fast response, and a large range of possible actuation frequencies, such as 0-20 kHz.

As an example of how an EAM device can be constructed and can operate, FIGS. 1 and 2 show two possible operating modes for an EAP device that comprises an electroactive polymer layer 14 sandwiched between electrodes 10, 12 on opposite sides of the electroactive polymer layer 14. FIG. 1 shows a device which is not clamped to a carrier layer. A voltage is used to cause the electroactive polymer layer to expand in all directions as shown. FIG. 2 shows a device which is designed so that the expansion arises only in one direction. To this end the structure of FIG. 1 is clamped or attached to a carrier layer 16. A voltage is used to cause the electroactive polymer layer to curve or bow. The nature of this movement arises from the interaction between the active layer which expands when actuated, and the passive carrier layer which does not.

For certain classes of EAP, application of a small force (mechanical load) to the device generates an electrical signal in response. This allows a single EAP structure to be used both for actuation and for sensing. However, state of the art EAP based actuator/sensors have typically provided sensing and actuation functions which are separated from one another, either physically—wherein a different region or portion of the device is used for sensing as for actuation, with separately provided electrical connection to each for example—or temporally, wherein the single device is sequentially alternated between a sensing and an actuation function.

For example US 2014/0139329 discloses an EAP system comprising a sensing circuit, an actuating circuit and a switching circuit. The sensing circuit is adapted to detect a signal from the EAP when it is deformed. Only subsequently does the switching circuit then activate the actuating circuit so that it can generate an actuation based on the sensing input. Hence, sensing and actuation are temporally separated from one another: sensing and actuation occur sequentially, one following on from the other.

There is a need for a device and operating method wherein the sensing functionality is optimized to provide high sensor sensitivity, capable of delivering significantly improved accuracy and/or precision in the measurement of applied loads.

SUMMARY OF THE INVENTION

It is an object of the invention to at least partially fulfil the aforementioned need. This object is achieved with the invention as defined with the independent claims. The dependent claims provide advantageous embodiments.

According to the invention, there is provided a device capable of actuation and sensing simultaneously. The actuator can be a transducer. The device can be an actuator and/or sensor or a transducer device.

According to the invention there is also provided a method of simultaneous sensing and actuation using an actuator. Hereinafter, features described for the device can be translated to features or steps of the method and vice versa unless otherwise indicated. Translated features at least have the same advantages as described for the original features.

In the invention, the first control signal is for use in actuation of the device and the electrical second control signal is for use in sensing by the device. The device is thus controlled using a control signal that is effectively composed of an actuation signal and a sensing signal.

The actuator, due to the electroactive material, responds to an electric field or force generated by such field. Hence, at least the sensing signal is an electrical signal so that mechanical resonance of the actuator can be determined from that electrical sensing signal.

The first control signal can be any type of control signal as long as it is suitable for causing an actuation. Thus, the first control signal can be an optical control signal. In that case the electroactive material must also respond to application of optical signals with a deformation. The person skilled in the art will know where to find such materials in the art. In such case, the arrangement of the device can comprise units for guiding optical signals to a first part of the material. Such units can comprise mirrors, lenses optical fibres etc. It is convenient to use the electroactive property of the actuator used for the sensing to also actuate the actuator. In the latter case the actuation signal needs to be an electrical actuation signal and the device and/or the electroactive structure can comprise one or more electrode arrangements for applying such actuation control signal.

The actuation signal and sensing signal, when both are electrical, can be provided separately to one or more electrode arrangements, but can also be superposed to from a combined control signal before providing the combined control signal to one or more electrode arrangements. Preferably, there is only one and the same electrode arrangement for providing the actuation and sensing signal to.

The device and method of the invention make use of the following effect. When the sensing signal is applied at a frequency matching the mechanical resonance frequency, or one of its harmonics, of the EAM structure, a mechanical standing wave is established in the structure which in turn affects the electrical characteristics of the structure. In particular, the impedance of the structure is lower for a sensing signal (and thus for that part of control signal) matching the resonance frequency, due to the mechanical vibration being in-phase with the sensing signal. Conversely, the impedance of the material is higher for a sensing signal matching the anti-resonance frequency of the material, due to the mechanical vibration being out of phase with the sensing signal. It appears that at such frequencies sensing is extremely effective while it does not disturb longer term simultaneous actuation.

Any mechanical load, such as for example a pressure, applied to the electroactive structure may cause a damping in the structure, causing its resonance frequency (and the anti-resonance frequency) to shift away from their ordinary un-damped values, thereby inducing a disparity between the high-frequency sensing signal and the fundamental frequency of mechanical vibration (or the anti-resonant equivalent, in the case of anti-resonance matching). All changes of characteristics of the resonant electroactive material structure caused by the change of the shift in resonance frequency can be advantageously used to detect a mechanical load with increased sensitivity. Thus, a shift in resonance frequency can be detected and/or determined. Detection and or determination of impedance can be done with advantage as will be elucidated herein below. The above holds for all devices that are for both actuation and sensing based on an EAM. The invention can thus also be used in a device as described in US2014/0139329. The invention can also be used using a device, wherein the electroactive material structure comprises a first part for actuation and a second part for sensing, wherein second part is different from the first part and wherein the control signal is applied to the electroactive material structure such that the actuation signal is applied to the first part and the sensing signal is applied to the second part.

In the invention, combining the actuation signal with the sensing signal can comprise or consist of at least partially superposing the actuation signal with the sensing signal in time. A control system generated this way can provide simultaneous actuation (due to the actuation signal part) and sensing (due to the sensing signal part) capability to the device. This gives a device the capability of sensing during activation. As described herein before, US2014/0139329 only describes sequential sensing and actuation meaning that actuation needs to be stopped before sensing can start.

In conjunction with especially the feature of the previous paragraph, the control signal is preferably provided to the same part of the active material structure instead of the situation wherein the control signal is applied to the electroactive material structure such that the actuation signal is applied to the first part and the sensing signal is applied to the second part and the second part is different from the first part. Although, the latter provides simultaneous actuation and sensing just like the former, this is at spatially different locations (spatially different active electroactive material structure areas) whereas for the former this can be at the same location (single active area of an EAM structure). The former will be more advantage as its sensing may thus be more accurate and the device may be smaller and/or less complicated as only one part needs to be accommodated and addressed with a control signal US 2002/0130673 mentions the possibility of achieving combined sensing and actuation in the same active area of a polymer by means of superposing a low amplitude, high frequency AC sensing signal on top of a primary driving (actuation) signal. However, the current variation of the invention provides an optimization of the device and method to achieve high sensing sensitivity which could reliably facilitate accurate real-time measurement of the magnitude of applied mechanical loads.

By superposing a lower-amplitude, high frequency sensing signal on top of a higher amplitude primary actuation signal, sensing and actuation functions may be achieved simultaneously, The amplitude of the sensing signal may be significantly less than that of the actuation signal, for example <10%, <5% or even <1% of that of the actuation signal. In this way the deformation response in the actuator may be negligible for the sensing signal compared to that stimulated by the actuation signal. Hence precision, accuracy and stability of the device as an actuator is not compromised.

The first control signal can have a frequency that is less than the sensing signal frequency. For example, the signal level of the first control signal can be substantially constant (DC signal) within a time period for which the sensing signal alternates. Alternatively, the actuation frequency can be a factor of 2, or 5 or 10 or 20 or 50 or 100 or higher than 100 lower than the sensing frequency.

If both signals are alternating signals, the actuation signal and the sensing signal each have an amplitude. Both signals can be provided with a range of amplitudes i.e. they can be provided as varying amplitude signals. The range of amplitudes can have a maximal amplitude. If both signals are electrical signals (the actuation signal) may be an alternating signal having a DC signal (although with DC level which varies in dependence on the actuation desired), or may have an alternating amplitude (AC signal). In the latter case, the maximal amplitude (peak amplitude) of the sensing signal may be <10%, <5% or even <1%, of the peak amplitude of the actuation signal. The frequency of the actuation signal in the latter case may also be significantly less than that of the sensing signal, for example at least two orders of magnitude less, in order to avoid interference of the actuator signal with the measurement signal.

In the case that the sensing signal is applied at a frequency matching the (undamped) anti-resonance frequency, for example, the sudden mismatch induced by the applied load may then be detected as a consequent drop in impedance as measured across the EAM structure. Alternatively, in the case that the sensing signal is applied matching the (undamped) resonance frequency, the mismatch may be detected as a consequent jump in impedance measured across the EAM structure. In either case, the sensing signal, in this way and as opposed to a situation substantially outside of resonance or antiresonance, allows for sensing with increased sensitivity.

To measure parameters of the sensing signal the device may further comprise a sensing element in electrical connection with the actuator. Preferably such parameters would allow determination of an impedance of the electroactive polymer structure in at least one instance of time or even for more instances of time such that the parameters are measured over time and hence impedance can be determined over time. The parameters typically comprise voltage over time and current over time such as to estimate phase differences between the two. The sensing element may monitor impedance (determined from the measured parameters) over time to thereby enable detection or determination of changes in impedance which may be used for example to indicate the application of a mechanical load to the structure. In certain examples, the sensing element may be adapted to measure a series resistance across the device for example. The element may comprise one or more circuit elements adapted to determine an impedance or may comprise, in examples, one or more IC chips being adapted for this purpose. The sensing element may comprise part of a broader analysis element or unit for example. The sensing element and the driver mechanism may, in examples, both be comprised as part of a broader processing assembly or unit. Alternatively, the sensing element may be comprised by the drive mechanism.

The sensing element may further be adapted to determine a magnitude of a mechanical load applied to the device at any given time based upon the determined impedance of the polymer structure at said given time. Hence changes in impedance may be used to indicate not only that a load has been applied but also the magnitude of that load or an indication of the magnitude. This may be achieved through the performing of an initial calibration step before use of the device. For example, the impedance across the device may be measured as ever increasing magnitudes of force/load are applied to the device, while keeping the two drive signals unchanged. This may then provide a reference graph or set of reference values by means of which particular measured impedances across the device, when in use, may be associated with particular magnitudes of applied force. In some examples, a plurality of calibration measurements may be performed, corresponding to different actuation states (and different corresponding actuation signals).

The electroactive polymer structure may comprise a relaxor ferroelectric material. The relaxor ferroelectric material can comprise or consist of an inorganic relaxor ferroelectric material, an organic relaxor ferroelectric material or a composite material comprising one or more of: the inorganic relaxor ferroelectric material and an organic relaxor ferroelectric material. The composite can comprise a matrix material that is or is not itself an electroactive material. Relaxor ferroelectrics are non-ferroelectric in the absence of an applied voltage, meaning that there is no electromechanical coupling when no drive signal is applied. When a drive signal is applied, for example, the electromagnetic coupling can become non-zero. Relaxor ferroelectrics provide larger magnitudes of actuation deformation (i.e. they possess larger electrostrictive constants), and greater sensing sensitivity compared with other known electroactive materials. However, the device is not limited to the use of Relaxor ferroelectrics, and piezoelectric materials, may also for example be used.

The device may comprise a plurality of actuators, each having a different resonant frequency. For example, each of the plurality may have a different size and/or shape and/or geometry, thereby providing a different resonant frequency. The plurality of structures may be arranged to form a structured assembly or array, for example. The different resonant frequencies may be detectable in the measured impedance signals and this for example used to determine to which EAM structure in the array or assembly in particular any load is being applied. Hence, a more precise determination of the position of an applied pressure might be determinable.

The invention also provides a method of simultaneous sensing and actuation. The method may comprise determining an impedance of the electroactive polymer structure over time, and further determining on the basis of said impedance the magnitude of any mechanical load applied to the structure over said time. For example, the impedance may be determined by measuring one or more electrical parameters of the drive signal. For example, the current and voltage of the drive signal may be monitored over time and from these a measure of impedance obtained.

According to one or more embodiments, the method may further comprise switching the amplitude or signal level of the first control signal between one or more constant values, or switching the maximal amplitude of the first component signal between one or more constant values, in order to thereby realise one or more associated actuation states of the actuator. The extent of deformation induced in the structure is related to the magnitude of the voltage applied across it. Different actuation states corresponding to differing extents of deformation may be realised by varying the first control signal. This variation might comprise switching the maximal amplitude of the control signal between a number of discrete predetermined values, or may comprise altering the value along a continuous spectrum of values, for example.

In some cases the method may further comprise a calibration step for determining a resonant frequency of the actuator and/or a calibration step for determining a calibration load of the actuator. Determining and possibly storing of determined values of such calibrations can be used to improve accuracy of determined mechanical loads of a device without having to know the mechanical resonance frequencies of actuators beforehand.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides an actuator and sensor device having an electroactive material (EAM) structure, and a controller for generating drive signals for application to the EAM structure. The controller can also be for generating a (small) high-frequency AC sensing signal on top of a larger actuation drive signal, the sensing signal having a frequency which either resonates or anti-resonates with the mechanical resonance frequency of the EAM structure. Application of mechanical loads to the device may be identified in changes in the impedance of the EAP structure—caused by dampening of the mechanical resonance. In this way the device facilitates and/or improves simultaneous sensing and actuation. Methods of simultaneous sensing and actuation are also provided.

Figure 1:
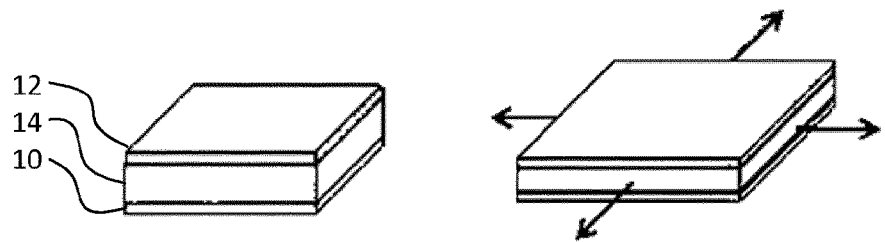
FIG. 1 shows a known electroactive polymer device which is not clamped.
Figure 2:
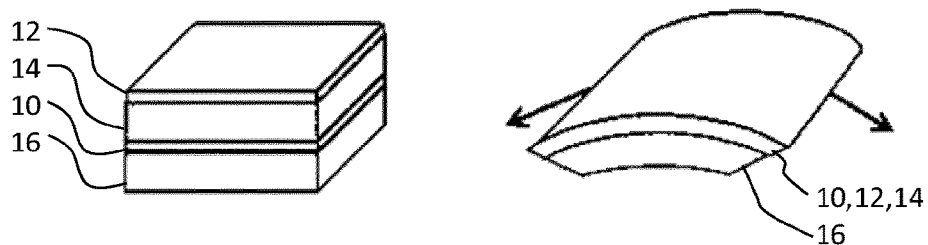
FIG. 2 shows a known electroactive polymer device which is constrained by a backing layer.

FIGS. 1 and 2 are described in the background section of the application and are used to describe how an EAP device can work in a general sense.

Figure 3:
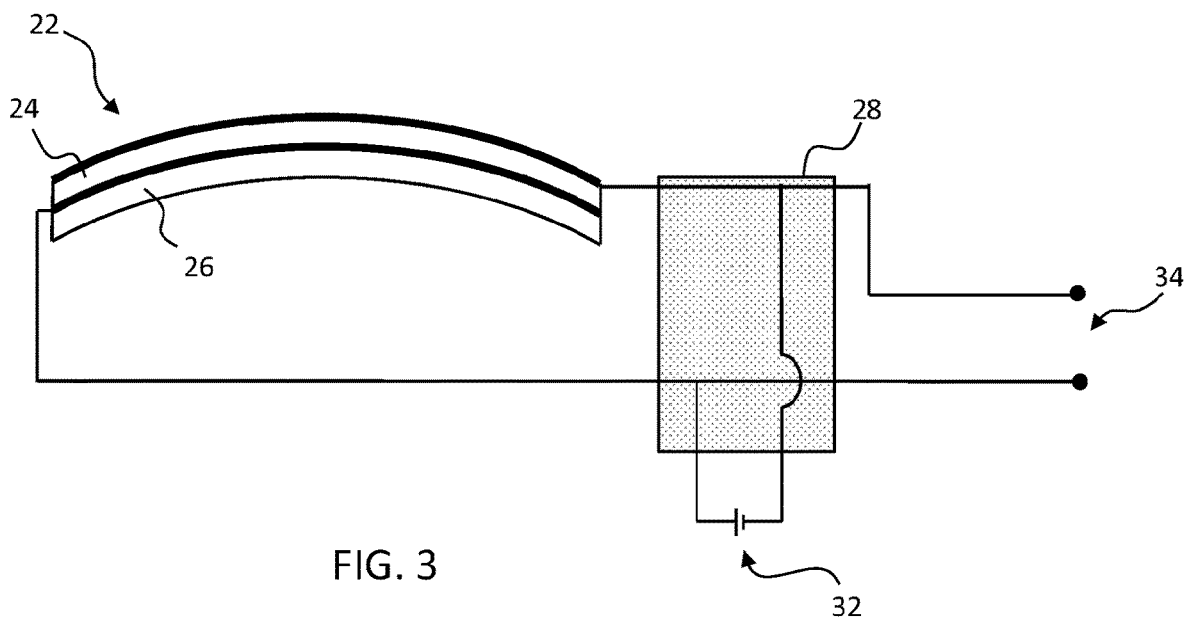
FIG. 3 depicts a first example arrangement for an example actuator and sensor device.

In FIG. 3 is shown an EAP actuator 22, comprising an upper EAP material layer 24 sandwiched between two electrodes. The sandwich is disposed and attached on top of a lower carrier layer 26. The electrodes are electrically connected via a signal processing element 28 with first (DC) drive signal input 32 and second (AC) drive signal input 34 (A signal controller). The first drive signal input 32 is for application of a (relative) high power (or high voltage) actuation drive signal. The second signal input 34 is for application of a (relative) low power (low voltage) alternating sensing signal. The signal processing element superposes the first and second drive signals to form a third combined drive signal (referred to as the control signal), which is applied across the electrodes of the EAP actuator 22. The signal processing element can also have multiple outputs providing the first and second drive signals to the EAP material layer such that they are applied in a combined way.

The signal processing element may in examples comprise a number of component elements for performing one or more of the following functions: signal generation, signal combination and/or separation, signal switching, signal coupling and decoupling, signal sensing, signal analysis. In the latter case, the first and second drive signal inputs 32 and 34 may be encompassed within the processing unit 28 itself, the processing unit comprising elements for generating AC and/or DC signals and, in some cases, elements for analysis of electrical parameters of one or both signals.

The electrical connections of the arrangement of FIG. 3 are shown connected to electrodes of an electrode arrangement at the top and bottom planar surfaces of the EAP layer structure for example. Flexible electrode arrangements may be used for this purpose. These can be thin electrodes of metal or electrically conductive organic materials. Application of DC and/or AC voltages to the electrodes allows the generation of an electric field across the EAP layer which stimulates a corresponding deformation.

Although the first drive signal input 32 in the arrangement of FIG. 3 comprises a DC input, in alternative arrangements, this input may comprise an AC drive signal input. In either case, the relative power (voltage) of the actuation drive signal preferably significantly exceeds that of the applied sensing signal. In the case that both signals comprise AC signals, the maximal amplitude of the sensing signal (applied at 34) may be less than 10% of the maximal amplitude of the actuation drive signal (applied at 32), for example less than 5% or even less than 1% of the maximal amplitude of the actuation drive signal. In the case that the sensing signal comprises an AC signal, and the actuation signal comprises a fixed amplitude DC bias signal, the maximal amplitude of the AC signal may be less than 10% of the fixed amplitude of the DC bias signal, for example less than 5% or even less than 1% of the fixed amplitude of the DC bias signal. For the example of FIG. 3, the control signal generated by the signal processing element 28 comprises a high frequency, low-amplitude AC signal superposed atop a high amplitude DC bias signal.

In the example of FIG. 3, the EAP is a dielectric elastomeric material (see herein below). As described in preceding sections, the application of a DC bias of sufficient amplitude across the electroactive polymer layer 24 stimulates a compression of the layer along a first perpendicular direction to the layer stack 24/26 such that the layer expands in directions perpendicular to the first perpendicular direction like explained for FIG. 1. If the layer is coupled with a passive carrier layer 26 the expansion of the polymer results in a deformation like explained for FIG. 2. The deformation can for example comprise a bending or warping, of the overall structure, which may be used to provide an actuation force. In FIG. 3, the actuator structure 22 is shown in an 'active' or 'actuated' state, wherein a DC bias is being applied of sufficient magnitude to cause a bending deformation of the structure.

As is well known, the extent of expansion varies in relation to the magnitude of the electric field/electric current applied across the device. Hence by varying the amplitude of the DC bias, deformation of differing degrees/extent may be induced, and differing magnitudes of actuation forces applied (or differing amounts of actuation work done, for example).

The high frequency AC signal superposed atop the DC bias also stimulates a mechanical deformation response in the material, but a deformation response which is periodic, rather than fixed (i.e. an oscillation). However, since the maximal amplitude of the high frequency signal is significantly lower than the amplitude of the DC bias signal (for example two orders of magnitude lower than that of the DC bias signal, for example, 1% of that of the DC signal), the corresponding displacement amplitude of the stimulated deformation is effectively negligible compared to the primary actuation displacement. Hence the accuracy and stability of the actuation is substantially not affected by the superposition of the sensing signal.

The overlay of a low-amplitude high frequency oscillation signal on top of the DC bias allows for an electrical feedback mechanism to be incorporated within the primary actuator driving mechanism itself. At certain frequencies, in particular at frequencies which match, or are harmonic with the mechanical resonant frequency of the actuator structure 22, a small mechanical standing wave is established in the material of the actuator. This in turn influences the electrical characteristics of the material. When the sensing signal is driven at the resonance frequency of the material, the corresponding impedance of the material is lower (compared to when driven at non-resonance) due to the mechanical vibration being in-phase with the electrical driving signal.

The mechanical resonance frequency of a structure is the frequency at which a structure will naturally tend to oscillate, upon being displaced from its equilibrium position, and is determined by intrinsic structural properties of the structure (e.g. geometry, size, shape, thickness, mass etc.). The mechanical oscillation of the EAP structure will not necessarily follow the drive frequency of the electrical signal applied to it, but will tend to fall back to its natural resonance frequency, with the drive frequency interfering with that oscillation either constructively or destructively, depending upon the degree to which the driving frequency is either out of phase or in phase with the natural oscillating frequency (resonance frequency).

When the high-frequency signal is driven at the anti-resonance frequency of the EAP structure, the impedance of the EAP is higher, due to the mechanical vibration of the material being out of phase with the oscillation of the drive signal (the electrically induced mechanical strains are out of phase with the electrical excitation). In other words, whenever, for instance, a positive current is being applied to the EAP by the drive signal, the out of phase mechanical strains are at the same moment inducing a current in the opposite direction (i.e. out of phase behaviour). In the ideal (model) case these opposing currents cancel each other out, and no current can flow at all (i.e. infinite impedance), but in real-world scenarios no full cancellation occurs and this effect is measured as an (effective) higher resistance of the electrical current (i.e. higher impedance). In particular, when the signal is driven at the anti-resonance frequency of the actuator material, the impedance of the EAP is at a maximum.

The relationship may be further understood by considering equation (1) below. The impedance of an ideal EAP at resonance and anti-resonance depends on the particular type or mode of deformation. It is most common to bring the EAP into lateral resonance (i.e. length or width). The impedance of the EAP is governed by the dielectric properties of the material and the electromechanical coupling and electrical and mechanical losses. For simplicity, when ignoring the electrical and mechanical losses, for an EAP with length l, width w and thickness t, deforming in lateral extension, the impedance of the EAP is given by:

$$Z(\omega) = \cfrac{1}{i\omega \cfrac{lw}{t}\varepsilon_{33}^T \left[(k_{31})^2 \cfrac{\tan\left(\cfrac{\omega l}{2}(\rho s_{11}^E)^{1/2}\right)}{\cfrac{\omega l}{2}(\rho s_{11}^E)^{1/2}\gamma \alpha^{(E)}} + 1 - (k_{31})^2\right]} \quad (1)$$

where $\varepsilon_{33}^T$ is the dielectric constant, $k_{31}$ is the lateral electromechanical coupling factor, p is the density of the EAP and $s_{11}^E$ is the compliance in the lateral direction. At anti-resonance frequency, $\omega_a$, $$\tan\left(\frac{\omega l}{2}(\rho s_{11}^E)^{1/2}\right) = 0$$

and Z is highest.

A real EAP has losses and can be modelled or represented by a capacitor with a resistor in series, the resistance of which is greatest at the anti-resonance frequency. In the descriptions which follow, therefore, 'impedance' and 'series resistance' ($R_S$) may be used interchangeably with reference to the device. However, series resistance is to be understood in this context as referring simply to a model in which the actuator/sensor is represented electronically by a capacitor in series with a resistor, having resistance $R_S$.

In consequence of the above-described relationship between impedance and resonance, when the drive signal is being driven at the anti-resonance frequency, any small deviations which occur in its frequency away from anti-resonance will be detectable in a corresponding sharp drop-off the in measurable impedance of the EAP structure 22. It is this physical effect which allows mechanical (load) sensing to be achieved and with increased precision. Application of pressure or load to the EAP structure results in a dampening of any resonance effects which are occurring within the material. If the drive signal is oscillating at the anti-resonance or resonance frequency of the material when the load is applied, the dampening effect will be identifiable within real-time measurements of the EAP impedance (i.e. series resistance $R_S$), as the sudden cessation of resonance will effect a consequent sharp decline in the impedance. Hence by monitoring the impedance of the structure over time, while the actuator is in operation (for example by monitoring the voltage and current of the high-frequency signal over time), pressures and loads applied to the structure can be sensed, and in some cases quantitatively measured (as will be described below).

The link between impedance on the one hand, and the phase difference between the electrical drive frequency of the signal and the mechanical oscillating frequency of the material on the other, allows for highly sensitive measurement of applied mechanical forces to the EAP to be achieved through the monitoring of electrical properties of the control signal only. This hence provides a highly simple, straightforward and efficient means for achieving simultaneous actuation and sensing using a single EAP device. Moreover, embodiments of the invention allow simultaneous sensing and actuation over the same region of EAP structure (i.e. spatially simultaneous sensing and actuation). This means that a device performing both functions can be made with a much smaller form factor, without sacrificing sensitivity or resolution of sensing for example. Moreover, only a single set of (electrical) connections is require to be provided to the device (as opposed to two or more sets of connections, one for each dedicated sensing or actuation region required for prior art devices) which is advantageous in terms of cost and reduced complexity, and in cases where watertight connections are required for example (for instance in shaving/ catheters/oral healthcare) and/or where an array of actuators/ sensors is to be constructed.

The frequency of the high-frequency sensing signal may typically be in the range of 1 kHz to 1 MHz, depending on the particular geometry of the actuator. Note that in the case that the actuator drive signal comprises an AC drive signal, the frequency of this signal is significantly lower than that of the alternating sensing signal. The (low frequency) actuation voltage in this case may for example be at least two orders of magnitude lower than the high frequency signal voltage, to avoid interference of the actuator signal with the measurement signal.

Figure 4:
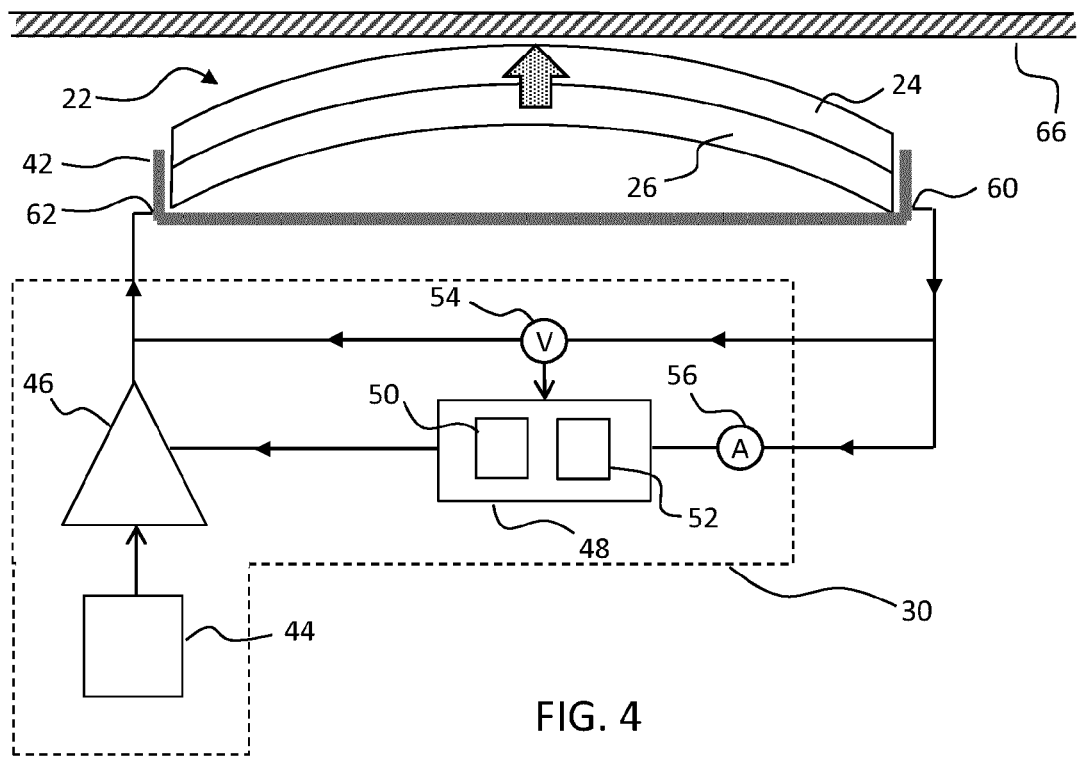
FIG. 4 depicts a second example arrangement for an example actuator and sensor device.

FIG. 4 shows a second example of an EAP actuator and sensor device according to embodiments of the invention, wherein the arrangement of the signal driving and processing elements is depicted in more detail. An EAP actuator 22 such as described with reference to FIG. 3 and having an EAP material layer 24 and passive carrier layer 26 is held within a housing 42, and is electrically coupled with a controller 30. The controller in the example of FIG. 4 comprises both signal generation elements (drive elements) and signal processing and analysis elements (sensor elements).

An actuator control element 44 generates a high-amplitude actuator drive signal (for example a fixed DC bias voltage) which is transmitted to a signal amplifier device 46. A sensor control element 48 comprises both a driver element 50 for generating the high amplitude sensor signals, and a processing element 52 for analysing electrical properties of the sensor signal after passage across the actuator. To this end, the drive mechanism 30 further comprises a voltmeter 54, connected across with the EAP actuator 22, and an ammeter 56 connected in series between the outgoing electrical terminal 60 of the actuator and the sensor control element 48. The voltmeter 54 and ammeter 56 are both signally connected with the sensor control element 48, such that data generated by them may be utilised by the sensor element 52 in order to determine an impedance of the actuator 22 (that is, the equivalent series resistance $R_S$ where the device is modelled as an ideal capacitor with a resistor in series, i.e. the real part of the complex impedance).

Drive signals generated by the actuator control element 44 and sensor control element 48 are superposed by the amplifier element 46, either in advance of their combined amplification, or after their independent amplification. In some examples, the amplifier element 46 might be replaced simply by a combiner. In this case actuator control element 44 and sensor control element 48 may be adapted to amplify their generated actuation and sensing signals locally, in advance of outputting them to the combiner. In this case, the component 46 may simply be an element similar to signal processing element 28 (in FIG. 3)

The combined drive signal is then transmitted to ingoing terminal 62 of the EAP actuator 22. The high amplitude DC component of the combined drive signal stimulates a deformation response in the actuator, as illustrated in FIG. 4. The EAP is held within shown housing 42. For the most reproducible (i.e. reliable/accurate) results, the EAP may be clamped in position. For example, the actuator may be clamped within housing 42, and the housing then positioned so as to align the device with the target actuation area.

For illustration, a target actuation area 66 is shown in FIG. 4, wherein the actuator is deformed by the DC drive signal to apply pressure to the target area. In examples, the target area might for example comprise a region of a person's skin, for instance, such that pressure may both be applied to the skin, but force applied upon the actuator by the skin simultaneously sensed by the device (e.g. it can be sensed how hard the user is pressing the actuator-containing device to their skin). In some examples, an (optional) force transfer mechanism may additionally be provided, for delivery of forces in a controlled way to or from the actuator surface.

The low-amplitude AC component of the drive signal stimulates a low amplitude periodic response in the EAP layer 24, for example oscillating the structure at its resonant or anti-resonant frequency.

The voltage of the combined drive signal and the resulting current are fed to sensor control element 48. Typically the AC currents may be in the range of 0.1 mA to 1 mA, but may be up to 10 mA. Higher currents may cause too much heating.

In some cases, the drive mechanism 30 may further comprise one or more signal decoupling elements, for example a high pass filter, for the purpose of isolating high-frequency components for analysis by the sensing element 52 of sensor control element 48.

The sensing element 52 of sensor control element 48 may use measurements provided by voltmeter 54 and ammeter 56 in order to determine a series resistance across the actuator, as experienced by the applied drive signal(s). The series resistance may be determined in real time, and monitored for example for sudden changes in resistance, which as explained above, may be used to indicate the presence and magnitude of loads and pressures applied to the actuator 22.

Figure 5:
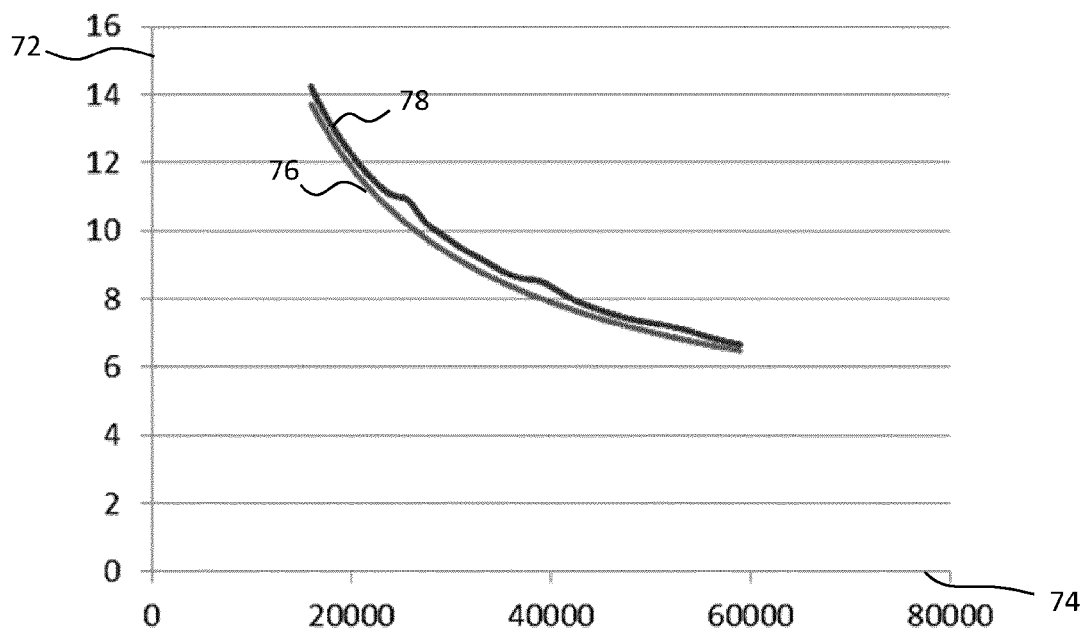
FIG. 5 shows a graph illustrating series resistance (of an example EAP actuator) versus sensor signal frequency for two different fixed actuation voltages.

In order to establish in the actuator structure 22 a high-sensitivity state of resonant or anti-resonant oscillation— such that pressures and forces may be readily detected through changes in measured series resistance—it may be necessary or desirable to perform one or more calibration steps, in advance of actuator operation, in order to determine a resonant or anti-resonant frequency of the device. To this end a 'sweep' may be performed, for each of two or more fixed actuation voltages, across a range of sensor-signal frequencies, and a corresponding series resistance measured for each of the sensor frequencies. FIG. 5 illustrates a set of results for one example sweep, wherein measured series resistance (in Ohms) is shown on the y-axis 72, and sensor signal frequency (in Hz) on the x-axis 74, and wherein line 76 shows the corresponding trace for an actuation voltage of 0V (i.e. no actuation) and line 78 the trace for an actuation voltage of 150V. As can be seen from the graph, the resistance values for the 150V sweep demonstrate a slight jump at two points along the sweep—at around 24 KHz, and at around 40 KHz.

The resistance values for the 0V sweep indicate no variation about the primary curve (which reflects simply a capacitive complex impedance function) as the AC frequency is varied. The efficiency of the electromechanical coupling in the EAP material is dependent on the magnitude of the DC bias voltage (the greater the DC bias, the better the coupling). At 0V bias, there is little or no coupling, and hence zero (or unmeasurably small) deformation response in the material to the AC signal. The 0V bias sweep hence provides a convenient baseline (and thus calibration line) against which to compare an AC frequency sweep at a higher (actuation inducing) DC voltage.

Figure 6:
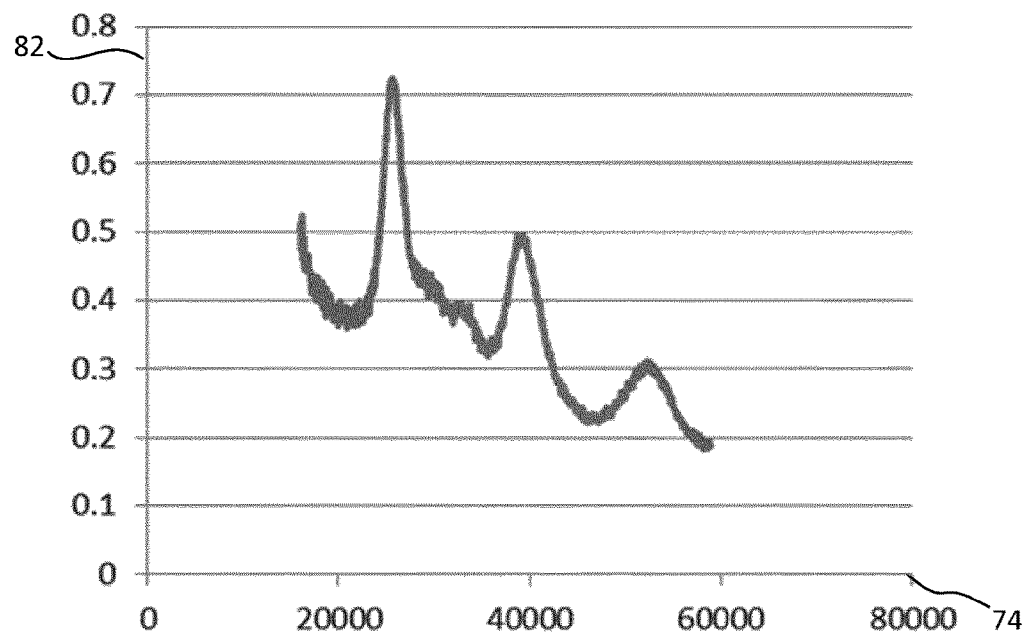
FIG. 6 shows a graph illustrating the difference between the two signal traces of FIG. 5.

The anti-resonant frequency of the device may be identified by finding the AC frequency for which the difference between the measured resistance values for the two DC voltages is the greatest. In FIG. 6 is illustrated more clearly the differences between the two signal traces 76 and 78, with difference in measured resistance 82 on the y-axis and corresponding sensor signal frequency 74 on the x-axis. The two larger jumps in resistance are clearly visible in this graph, with the larger of the two being the jump occurring at 24 KHz. Hence the anti-resonant frequency for the example device represented by FIGS. 5 and 6 is 24 KHz. This is the point of highest sensitivity for the device, i.e. the point at which the series resistance is most sensitive to changes in the frequency of the applied drive signal (or to changes in the anti-resonant frequency of the structure, for a fixed applied drive frequency).

Although a DC bias of 0V is used for the first sweep in the example of FIGS. 5 and 6, in alternative examples a different (non-zero) first bias might be used. In this case, depending on the magnitude of the first voltage, the first sweep may indicate variations or peaks about the central curve. However, the anti-resonance frequency may still be found by identifying the frequency for which the difference between the measured resistance values for the two DC voltages is the greatest.

Figure 7:
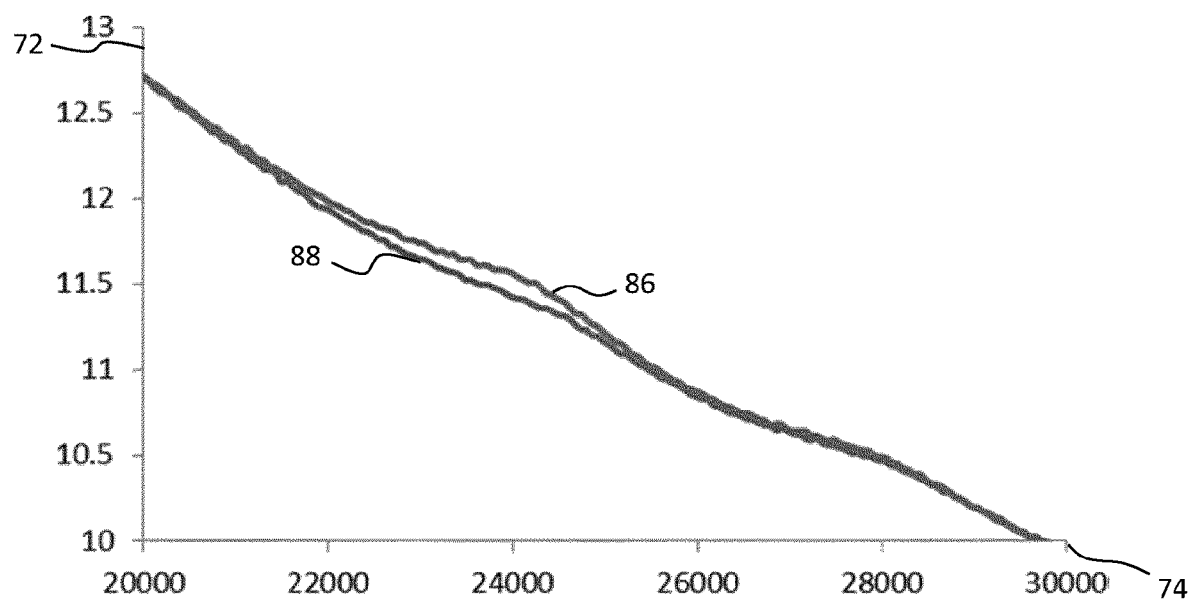
FIG. 7 shows a graph illustrating the effect of an applied load force on the measured resistance values across a range of sensor signal frequencies.

To illustrate the effect of applying a load to the device, FIG. 7 shows two resistance 72 versus frequency 74 'sweeps', for the same fixed (150V) DC bias voltage, but corresponding to differing loads applied to the actuator. Line 86 represents the sweep for no load applied to the device. This line is hence identical to line 78 in FIG. 5, but shown for a narrower range of frequencies and resistances. Line 88 represents the sweep for a load of 0.01N applied to the actuator. As can be seen, the effect of the load is to effectively 'iron out' the bump in resistance at the device resonant frequency of ~24 KHz. The application of 0.01N to the device is enough to dampen out much of the resonance effect caused by the applied high frequency signal. This dampening out allows the presence of even small loads to be detected.

This dampening effect is greater the higher the magnitude of applied load force. This relationship allows applied loads not just to be detected, but also to be measured quantitatively. To achieve measuring of loads, it may be necessary to perform an additional calibration step in advance of operation of the actuator. This calibration step is performed after determination of the anti-resonance frequency (described above). Once the anti-resonance frequency is known, a sweep may be performed, for fixed DC bias voltage, and for fixed AC frequency (i.e. the anti-resonance frequency), but measuring series resistance as a function of applied load to the device. Once this relationship is known, for a given fixed frequency signal, it may be utilised while the device is in operation to allow measured series resistance to provide a near direct measure of the magnitude of applied load.

Figure 8:
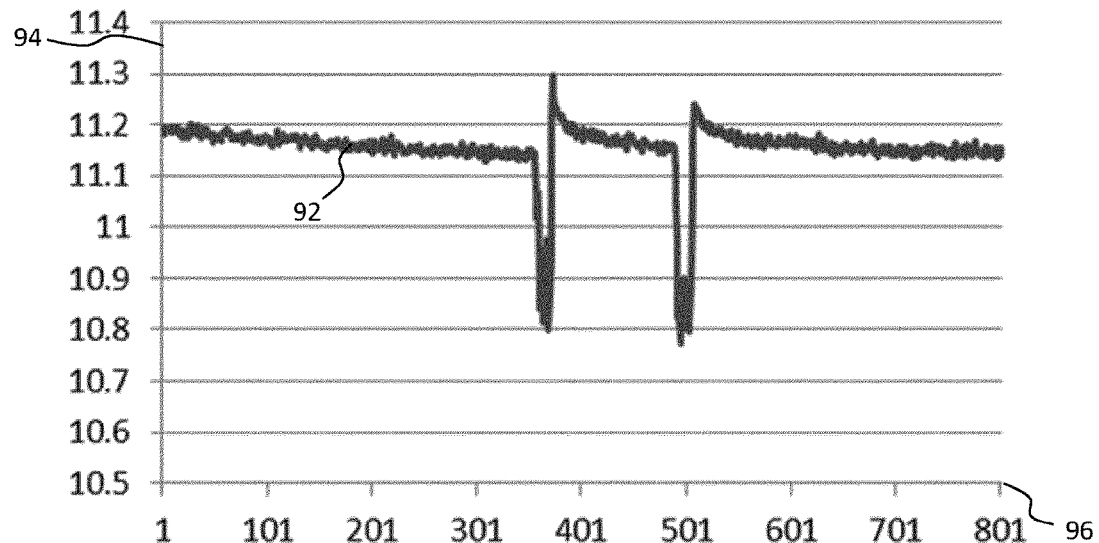
FIG. 8 shows a graph illustrating measured resistance values over time (of an example EAP actuator), wherein a load is applied at two distinct points in time.

To illustrate this, in FIG. 8 is shown a signal 92 representing the measured series resistance 94 (in Ohms) over time (in arbitrary units) 96 for an example actuator device being driven at a fixed DC bias of 150V and at a fixed AC frequency of 24 KHz (the resonant frequency of the device in question). At times t=350 and time t=500, the actuator is loaded with a 10 gram load. This leads in each case to a sharp decline in resistance 94, which lasts for the duration of each applied load. It is clear from FIG. 8 that the device provides a fast and highly precise response to applied loads, which is ideal for sensor applications. Although the magnitude of the applied force is already known in this case, through performing the calibration step described above in advance of operation, a graph of the sort shown in FIG. 8 could readily be used to determine not just the timings of load events, but also their precise magnitudes.

Figure 9:
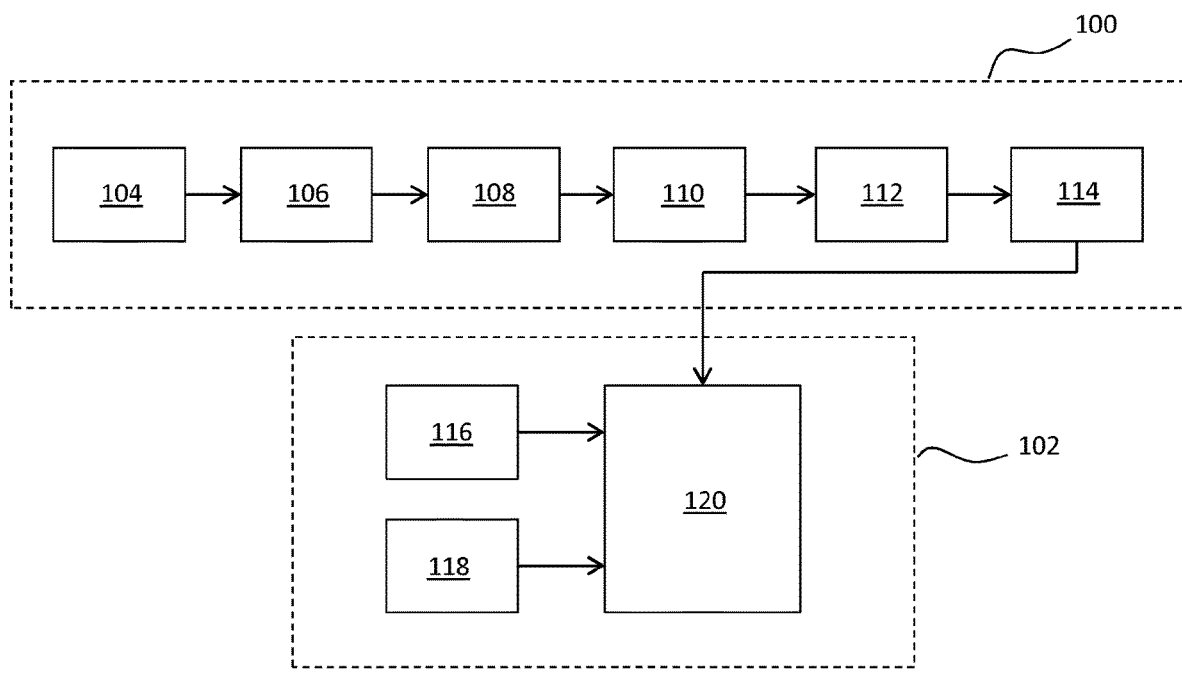
FIG. 9 schematically depicts steps in an example operating process for an EAP actuator and sensor device.

As discussed above, for full functionality of the device, as both an actuator and a sensor capable of measuring the magnitude and timings of applied loads, a number of preparatory calibration steps may be required. In FIG. 9 is shown a schematic diagram illustrating steps in an example operating process for the device. A first set of steps 100 is shown which represent preparatory calibration steps to be performed in advance of operating the device. A second set of steps 102 is shown which represent steps performed during use of the device.

Preparatory stage 100 comprises steps for determining the resonant frequency of the device and for determining a relationship between measured resistance and applied load at said determined resonant frequency. A first frequency sweep 104 is performed, at an applied DC bias of 0V, and resistance responses measured. A fixed DC bias is then applied in step 106, preferably corresponding to a desired actuation state of the device. A second frequency sweep is then performed in step 108 at the fixed non-zero DC bias, and corresponding resistance values recorded. The results of the two sweeps are then compared in step 110 to determine the difference in the obtained resistance values for each across the range of frequencies (c.f. FIGS. 5 and 6). In step 112, the frequency for which the measured resistance values differ by the greatest amount is determined and the anti-resonance frequency thereby directly identified. Finally, in step 114, calibration data is obtained for series resistance across the device versus applied load, for a fixed DC bias voltage, and a fixed AC signal frequency—equal to the anti-resonance frequency determined in step 112.

Note that steps 106-114 may be in some cases repeated for as many DC voltages as are desired, for example to gather data relating to a plurality of different actuation positions, in the case that variable actuation extent is to be employed in the operation of the device.

Once calibration steps 100 have been performed, the device may be operated according to the steps of the operation stage 102. This merely comprises (step 116) utilising the sensor control element 48 (see FIG. 4) to drive the high-frequency sensing signal at a frequency equal to the anti-resonance frequency as determined in step 112, and to simultaneously measure a resistance of the EAP over time, as the device is in use.

At the same time, a high amplitude actuation bias is applied in step 118, as and when required, to stimulate a corresponding deformation in response.

The resistance values obtained by step 116 may be monitored in step 120 and by means of calibration data obtained in step 114, the magnitude of any applied loads on the device determined in real-time. Different sets of calibration data may be employed for different magnitudes of applied actuation voltage, for example, to thereby enable sensing functionality in any particular actuation state.

FIG. 9 represents one simple example for using the device. In one or more alternative embodiments, however, the calibrations steps of preparatory stage 100 may be eliminated, without compromising the robustness and sensitivity of the device, thus advantageously reducing the system complexity and costs. According to these embodiments, the resonance frequency $f_r$ of an actuator is tightly controlled during production of device, such that the anti-resonance (or resonance) frequency is already known in advance, and can be relied upon not to change over time, or under different conditions.

The robustness of the results obtained by these embodiments may be further increased (for example to take account of possible variation in material resonance frequency due to temperature changes) by additionally measuring impedance of the device over time for applied drive signal frequency (/ies) for which there is known to be little load-dependent (impedance) response. For example, frequencies which are below the resonance frequency (e.g. ~20 KHz for the device represented in FIGS. 5-8) may ideally be used, so as to avoid concurrence with the harmonics (i.e. $f_r/2$, $f_r/3$, $f_r/5$), and hence substantially eliminate any possible load dependency of the measured impedance.

By monitoring the impedance for these frequencies, at substantially the same time as for the higher (resonance-matching) frequency (for example alternating sequentially between the two frequencies to gather data for both), it is possible, by comparing the two, to determine whether measured changes in impedance at the higher frequency are caused by applied loads, or rather are caused by some natural drift, due to temperature (or other physical) changes in the material. Where the impedance values at the non-resonant frequency indicate a drift away from the expected 'factory' values, this indicates that the resonant frequency of the material has changed for non-load related reasons, and this change can be accounted for in the load measurements, for example by switching to consult a differently calibrated look-up-table to assess the load at the resonance frequency.

The method according to this embodiment may further comprise determining a ratio between the impedance measurements for the resonant and non-resonant frequencies, in order to provide a measure of load-relevant impedance, controlled for the influence of external factors such as temperature.

According to one or more embodiments, an actuation and sensing device may be provided comprising a plurality of actuator devices according to the above described examples, for example arranged in an array, or other desirable layout/shape. In examples, the plurality of devices may be provided such that each has a unique mechanical resonance frequency $f_r$. In this way, on application of high frequency sensing signals to the array of devices, the characteristic (unique) resonance frequency of each device may be used to determine which actuator in the array is being stimulated as a sensor, i.e. to give the position of the sensor/actuator in the array.

For example, a common drive signal may be applied across all devices in the array, the common signal comprising a sequential series of signals of different frequencies (i.e. the known different resonance—or anti-resonance—frequencies of the devices). If the time-sweep of frequencies is faster than the sensor input, then a corresponding drop (or rise) in impedance will be detectable across the devices only for that frequency corresponding to the specific device which is stimulated, i.e. measured impedance will drop as the frequency sweep moves into $f_r$ corresponding to the stimulated device, and then rise again (or vice-versa) as the sweep moves out of $f_r$.

Although in the detailed description herein above the construction and operation of devices and systems according to the invention have been described for EAPs, the invention can in fact be used for devices based on other kinds of EAM material. Hence, unless indicated otherwise, the EAP materials hereinabove can be replaced with other EAM materials. Such other EAM materials are known in the art and the person skilled in the art will know where to find them and how to apply them. A number of options will be described herein below.

A common sub-division of EAM devices is into field-driven and current or charge (ion) driven EAMs. Field-driven EAMs are actuated by an electric field through direct electromechanical coupling, while the actuation mechanism for current or charge driven EAMs involves the diffusion of ions. The latter mechanism is more often found in the corresponding organic EAMs such as EAPs. While Field driven EAMs generally are driven with voltage signals and require corresponding voltage drivers/controllers, current driven EAMs generally are driven with current or charge signals sometimes requiring current drivers. Both classes of materials have multiple family members, each having their own advantages and disadvantages.

Field driven EAMs, can be organic or inorganic materials and if organic can be single molecule, oligomeric or polymeric. For the current invention they are preferably organic and then also oligomeric or even polymeric. The organic materials and especially polymers are an emerging class of materials of growing interest as they combine the actuation properties with material properties such as light weight, cheap manufacture and easy processing.

The field driven EAMs and thus also EAPs are generally piezoelectric and possibly ferroelectric and thus comprise a spontaneous permanent polarization (dipole moment), are electrostrictive and thus comprise only a polarization (dipole moment) when driven, but not when not driven or are dielectric relaxor materials. Such polymers include, but are not limited to, the sub-classes: piezoelectric polymers, ferroelectric polymers, electrostrictive polymers, relaxor ferroelectric polymers, dielectric elastomers, liquid crystal elastomers.

The lack of a spontaneous polarisation means that electrostrictors display little or no hysteretic loss even at very high frequencies of operation. The advantages are however gained at the expense of temperature stability. Relaxors operate best in situations where the temperature can be stabilised to within approximately 10° C. This may seem extremely limiting at first glance, but given that electrostrictors excel at high frequencies and very low driving fields, then the applications tend to be in specialised micro actuators. Temperature stabilisation of such small devices is relatively simple and often presents only a minor problem in the overall design and development process.

Preferably the EAM or EAP material is an electrostrictive polymer. More preferably it is a relaxor ferroelectric material. Such materials can have an electrostrictive constant that is high enough for good practical use, i.e. advantageous for simultaneous sensing and actuation functions. Relaxor ferroelectric materials are non-ferroelectric when zero driving field (i.e. voltage) is applied to them, but become ferroelectric during driving. Hence there is no electromechanical coupling present in the material at non-driving. The electromechanical coupling becomes non-zero when a drive signal is applied and can be measured through applying the small amplitude high frequency signal on top of the drive signal, in accordance with the procedures described above. Relaxor ferroelectric materials, moreover, benefit from a unique combination of high electromechanical coupling at non-zero drive signal and good actuation characteristics.

The most commonly used examples of inorganic relaxor ferroelectric materials are: lead magnesium niobate (PMN), lead magnesium niobate-lead titanate (PMN-PT) and lead lanthanum zirconate titanate (PLZT). But other are known in the art.

Examples of field-driven EAPs are piezoelectric polymers, ferroelectric polymers, electrostrictive polymers (such as PVDF based relaxor polymers or polyurethanes), dielectric elastomers and liquid crystal elastomers (LCE). Thus, preferably the EAP material is a relaxor ferroelectric polymer such as e.g. PVDF based relaxor ferroelectric based polymer. Such materials can be any one chosen from the group of materials herein below The sub-class electrostrictive polymers includes, but is not limited to:

Polyvinylidene fluoride (PVDF), Polyvinylidene fluoride-trifluoroethylene (PVDF-TrFE), Polyvinylidene fluoride-trifluoroethylene-chlorofluoroethylene (PVDF-TrFE-CFE), Polyvinylidene fluoride-trifluoroethylene-chlorotrifluoroethylene) (PVDF-TrFE-CTFE), Polyvinylidene fluoride-hexafluoropropylene (PVDF-HFP), polyurethanes or blends thereof.

The current driven EAMs and EAPs comprise conjugated polymers, Ionic Polymer Metal Composites, ionic gels and polymer gels.

Examples of ionic-driven EAPs are conjugated polymers, carbon nanotube (CNT) polymer composites and Ionic Polymer Metal Composites (IPMC).

The sub-class dielectric elastomers includes, but is not limited to:

acrylates, polyurethanes, silicones.

The sub-class conjugated polymers includes, but is not limited to:

polypyrrole, poly-3,4-ethylenedioxythiophene, poly(p-phenylene sulfide), polyanilines.

The materials above can be implanted as pure materials or as materials suspended in matrix materials. Matrix materials can comprise polymers.

To any actuation structure comprising EAM material, additional passive layers may be provided for influencing the behavior of the EAM layer in response to an applied drive signal.

The actuation arrangement or structure of an EAP device can have one or more electrodes for providing the control signal or drive signal to at least a part of the electroactive material. Preferably the arrangement comprises two electrodes. The EAP may be sandwiched between two or more electrodes. This sandwiching is needed for an actuator arrangement that comprises an elastomeric dielectric material, as its actuation is among others due to compressive force exerted by the electrodes attracting each other due to a drive signal. The two or more electrodes can be also be embedded in the elastomeric dielectric material. Electrodes can be patterned or not.

A substrate can be part of the actuation arrangement. It can be attached to the ensemble of EAP and electrodes between the electrodes or to one of the electrodes on the outside.

The electrodes may be stretchable so that they follow the deformation of the EAM material layer. This is especially advantageous for EAP materials. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylenedioxythiophene) poly(styrenesulfonate) (PEDOT: PSS). Metalized polyester films may also be used, such as metalized polyethylene terephthalate (PET), for example using an aluminum coating.

The materials for the different layers will be selected for example taking account of the elastic moduli (Young's moduli) of the different layers.

Additional layers to those discussed above may be used to adapt the electrical or mechanical behavior of the device, such as additional polymer layers.

The device may be used as a single actuator, or else there may be a line or array of the devices, for example to provide control of a 2D or 3D contour.

The invention can be applied in many EAP applications, including examples where a passive matrix array of actuators is of interest.

In many applications the main function of the product relies on the (local) manipulation of human tissue, or the actuation of tissue contacting interfaces. In such applications EAP actuators provide unique benefits mainly because of the small form factor, the flexibility and the high energy density. Hence EAP's can be easily integrated in soft, 3D-shaped and/or miniature products and interfaces. Examples of such applications are:

Skin cosmetic treatments such as skin actuation devices in the form of EAP-based skin patches which apply a constant or cyclic stretch to the skin in order to tension the skin or to reduce wrinkles;

Respiratory devices with a patient interface mask which has an EAP-based active cushion or seal, to provide an alternating normal pressure to the skin which reduces or prevents facial red marks;

Electric shavers with an adaptive shaving head. The height of the skin contacting surfaces can be adjusted using EAP actuators in order to influence the balance between closeness and irritation;

Oral cleaning devices such as an air floss with a dynamic nozzle actuator to improve the reach of the spray, especially in the spaces between the teeth. Alternatively, toothbrushes may be provided with activated tufts;

Consumer electronics devices or touch panels which provide local haptic feedback via an array of EAP transducers which is integrated in or near the user interface;

Catheters with a steerable tip to enable easy navigation in tortuous blood vessels.

Another category of relevant application which benefits from EAP actuators relates to the modification of light. Optical elements such as lenses, reflective surfaces, gratings etc. can be made adaptive by shape or position adaptation using EAP actuators. Here the benefits of EAPs are for example the lower power consumption.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A device for simultaneous actuation and sensing comprising:
   an actuator, the actuator comprising an actuator material capable of deforming upon application of a control signal to it, the actuator having a mechanical resonance frequency and a mechanical anti-resonance frequency;
   an electro-mechanical arrangement for applying a first electrical control signal to at least a first part of the actuator material for actuation of the actuator;
   an electrode arrangement for applying a second electrical control signal to at least a second part of the actuator material for sensing by the actuator; and
   a controller circuit,
   wherein the controller circuit provides the first electrical control signal to the electro-mechanical arrangement,
   wherein the controller circuit provides the second electrical control signal to the electrode arrangement,
   wherein the controller circuit provides the first electrical control signal and the second electrical control signal simultaneously, and
   wherein the controller circuit provides the second electrical control signal as an alternating signal having a sensing frequency that is harmonic with either the mechanical resonance frequency or the mechanical anti-resonance frequency.

2. The device as claimed in claim 1,
   wherein the electro-mechanical arrangement is a first electrode arrangement,
   wherein the electrode arrangement is a second electrode arrangement, and
   wherein the controller circuit is arranged to provide the first electrical control signal as an electrical control signal to the first electrode arrangement.

3. The device as claimed in claim 2, wherein the first electrode arrangement and the second electrode arrangement are arranged such that the at least first part of the actuator material and the at least second part of the actuator material overlap partly.

4. The device as claimed in claim 2, wherein the first electrode arrangement is the same as the second electrode arrangement.

5. The device as claimed in claim 3,
   wherein the controller circuit is arranged to generate a combined electrical control signal by superposing the first electrical control signal and the second electrical control signal, and
   wherein the controller circuit comprises an electrical output terminal for providing the combined electrical control signal to one or more electrode arrangements.

6. The device as claimed in claim 5, further comprising a sensing element electrically connect to the first electrode arrangement, wherein the sensing element is arranged to measure for each one of one or more instances in time, one or more electrical parameters of the first electrical control signal or of the combined electrical control signal from which the impedance of the actuator at each one of the one or more instances in time would be determinable.

7. The device as claimed in claim 6, wherein the sensing element is arranged to determine the magnitude of a mechanical load applied to the actuator at the one or more instances in time from the measured one or more electrical parameters or from the determined impedance of the actuator.

8. The device as claimed in claim 1,
wherein the controller circuit is arranged to provide the first electrical control signal with a first level, and
wherein the controller circuit is arranged to provide the second electrical control signal with a signal amplitude less than the first level.

9. The device as claimed in claim 8, wherein the controller circuit is arranged to provide the first electrical control signal as an alternating signal having an actuation frequency that is less than the sensing frequency.

10. The device as claimed in claim 1,
wherein the device comprises a plurality of electroactive material structures, and
wherein each of the plurality of electroactive material structures has a different mechanical resonant frequency.

11. The device as claimed in claim 1, wherein the actuator material comprises one of an inorganic relaxor ferroelectric material and organic relaxor ferroelectric material.

12. A method of simultaneous actuation and sensing using an actuator, the actuator comprising an actuator material capable of deforming upon application of a control signal to it, the actuator having a mechanical resonance frequency and a mechanical anti-resonance frequency, the actuator comprising an electro-mechanical arrangement for applying a first electrical control signal, to at least a first part of the actuator material and an electrode arrangement for applying a second electrical control signal to at least a second part of the actuator material, the method comprising:
providing, to the electro-mechanical arrangement, the first electrical control signal for actuation of the actuator; and
providing, to the electrode arrangement, the second electrical control signal for sensing by the actuator,
wherein the first electrical control signal and the second electrical control signal are provided such that they are applied to the respective parts of the actuator material simultaneously, and
wherein the second electrical control signal is provided as an alternating signal having a sensing frequency that is harmonic with either the mechanical resonance frequency or the mechanical anti-resonance frequency.

13. The method as claimed in claim 12,
wherein the electro-mechanical arrangement is a first electrode arrangement and the electrode arrangement is a second electrode arrangement, and
wherein providing the first electrical control signal comprises providing the first electrical control signal as an electrical control signal to the first electrode arrangement.

14. The method as claimed in claim 13, wherein the first electrode arrangement is the same as the second electrode arrangement.

15. The method as claimed in claim 13, further comprising generating a combined electrical control signal by superposing the first electrical control signal and the second electrical control signal.

16. The method as claimed in claim 15, further comprising:
measuring for each one of one or more instances in time, one or more electrical parameters of the first electrical control signal or of the combined electrical control signal from which the impedance of the actuator at each one of the one or more instances in time would be determinable.

17. The method as claimed in claim 16, comprising the step of determining the magnitude of a mechanical load applied to the actuator at the one or more instances in time from the measured one or more electrical parameters or from the determined impedance of the actuator.

18. The method as claimed in claim 12,
wherein the first electrical control signal comprises a first level, and
wherein providing the second electrical control signal comprises providing the second electrical control signal with a signal amplitude less than the first level.

19. The method as claimed in claim 12, further comprising:
determining a calibration resonant frequency of the actuator by:
varying the sensing frequency across a range of frequencies for each of two constant level first electrical control signals; and
measuring a corresponding impedance of the actuator for each frequency as the frequency is varied for each of two constant level first electrical control signals; and
determining the calibration resonant frequency by identifying the sensing frequency for which the corresponding measured impedance at the two constant level first electrical control signals differs by the greatest amount.

20. The method as claimed in claim 12, further comprising:
determining a calibration mechanical load applied to the actuator by:
varying a mechanical load applied to the actuator across a range of mechanical loads for a fixed sensing signal frequency; and
measuring a corresponding impedance of the actuator for each mechanical load as the mechanical load is varied for a fixed sensing signal frequency.

21. The device as claimed in claim 5, further comprising a sensing element electrically connect to the first electrode arrangement, wherein the sensing element is arranged to measure for each one of one or more instances in time, one or more electrical parameters of the first electrical control signal or of the combined electrical control signal and subsequently determine the impedance of the actuator for each one of the one or more instances in time from the measured one or more electrical parameters.

22. The method as claimed in claim 15, further comprising:
measuring for each one of one or more instances in time, one or more electrical parameters of the first electrical control signal or of the combined electrical control signal and subsequently determine the impedance of the actuator for each one of the one or more instances in time from the measured one or more electrical parameters.

* * * * *